United States Patent
Anai et al.

(10) Patent No.: US 11,931,808 B2
(45) Date of Patent: Mar. 19, 2024

(54) BONDING COMPOSITION, CONDUCTOR BONDING STRUCTURE, AND METHOD FOR PRODUCING SAME

(71) Applicant: MITSUI MINING & SMELTING CO., LTD., Tokyo (JP)

(72) Inventors: Kei Anai, Ageo (JP); Shinichi Yamauchi, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 439 days.

(21) Appl. No.: 17/262,924

(22) PCT Filed: Aug. 8, 2019

(86) PCT No.: PCT/JP2019/031325
§ 371 (c)(1),
(2) Date: Jan. 25, 2021

(87) PCT Pub. No.: WO2020/032161
PCT Pub. Date: Feb. 13, 2020

(65) Prior Publication Data
US 2021/0138541 A1  May 13, 2021

(30) Foreign Application Priority Data
Aug. 8, 2018 (JP) ................................. 2018-149768

(51) Int. Cl.
| | |
|---|---|
| B22F 7/06 | (2006.01) |
| B22F 1/10 | (2022.01) |
| B22F 1/103 | (2022.01) |
| B22F 1/107 | (2022.01) |
| B22F 1/145 | (2022.01) |
| B22F 7/04 | (2006.01) |
| H01B 1/20 | (2006.01) |

(52) U.S. Cl.
CPC ............... *B22F 7/064* (2013.01); *B22F 1/10* (2022.01); *B22F 1/107* (2022.01); *B22F 1/145* (2022.01); *B22F 7/04* (2013.01); *H01B 1/20* (2013.01); *B22F 1/103* (2022.01)

(58) Field of Classification Search
CPC .... B22F 7/064; B22F 1/00; B22F 3/10; B22F 7/08; B22F 7/04; B22F 1/105; B22F 1/103; H01B 1/20; H01B 1/22
See application file for complete search history.

(56) References Cited

U.S. PATENT DOCUMENTS

| | | | | |
|---|---|---|---|---|
| 2006/0210705 A1* | 9/2006 | Itoh | .......................... | H01B 1/22 |
| | | | | 427/372.2 |
| 2012/0298929 A1* | 11/2012 | Mizumura | ............... | H01B 1/22 |
| | | | | 252/514 |
| 2014/0367619 A1 | 12/2014 | Summers | | |
| 2017/0140847 A1 | 5/2017 | Kamikoriyama et al. | | |

FOREIGN PATENT DOCUMENTS

| | | | | |
|---|---|---|---|---|
| EP | 2 549 488 A1 | 1/2013 | | |
| JP | 2013-39580 | 2/2013 | | |
| JP | 2013-196936 | 9/2013 | | |
| JP | 2015-76232 | 4/2015 | | |
| JP | 2016-178047 | 10/2016 | | |
| JP | 2017-157329 | 9/2017 | | |
| WO | WO-2010095672 A1 * | 8/2010 | ............... | B22F 7/04 |
| WO | 2014/80662 | 5/2014 | | |
| WO | 2015/005178 A1 | 1/2015 | | |

OTHER PUBLICATIONS

WO2010095672A1 claims english (Year: 2010).*
WO2010095672A1 description english (Year: 2010).*
International Search Report for PCT/JP2019/031325, dated Nov. 5, 2019, 4 pages.
Written Opinion of the ISA for PCT/JP2019/031325, dated May 11, 2019, 4 pages.

* cited by examiner

Primary Examiner — Ricardo D Morales
(74) Attorney, Agent, or Firm — NIXON & VANDERHYE

(57) ABSTRACT

A bonding composition contains copper powder, a liquid medium, and a reducing agent. The reducing agent contains at least one amino group and a plurality of hydroxyl groups. The reducing agent has a boiling point that is higher than the boiling point of the liquid medium. The reducing agent has a melting point that is equal to or below the sintering temperature of the copper powder. Preferably, the reducing agent is bis(2hydroxyethyl)iminotris(hydroxymethyl)methane. Preferably, the bonding composition has a viscosity of from 10 Pa·s to 200 Pa·s at a shear rate of $10$ $s^{-1}$ at 25° C. Preferably, the bonding composition contains from 0.1 parts to 10 parts by mass of the reducing agent and from 10 parts to 40 parts by mass of the liquid medium with respect to 100 parts by mass of the copper powder.

14 Claims, No Drawings

_US 11,931,808 B2_

BONDING COMPOSITION, CONDUCTOR BONDING STRUCTURE, AND METHOD FOR PRODUCING SAME

This application is the U.S. national phase of International Application No. PCT/JP2019/031325 filed 8 Aug. 2019, which designated the U.S. and claims priority to JP Patent Application No. 2018-149768 filed 8 Aug. 2018, the entire contents of each of which are hereby incorporated by reference.

TECHNICAL FIELD

The present invention relates to a bonding composition used for bonding two portions. The present invention also relates to a method for producing a conductor bonding structure using the bonding composition, and a conductor bonding structure produced by the method.

BACKGROUND ART

With the recent global trend in energy saving, the use of semiconductor devices called power devices as power conversion and control equipment, such as inverters, has been increasing. Because power devices are for controlling a high current unlike integrated circuits such as memories and microprocessors, they generate a very large amount of heat during drive. To prevent semiconductor elements from getting damaged by this heat, semiconductor packages require measures for heat dissipation, such as cooling systems.

To significantly improve energy usage efficiency in devices, various semiconductor elements have been proposed, employing new materials such as wide band-gap (WBG) semiconductors, e.g., SiC and GaN, instead of conventionally employed Si. SiC and GaN have a wider band-gap than Si, thereby allowing SiC and GaN to have a higher driving temperature than Si. This, in turn, allows the cooling system of semiconductor packages to be simplified, thereby enabling downsizing of the entire device.

Solder, which has conventionally been used as a bonding material, has poor heat resistance, and therefore cannot be used for driving WBG devices which exceed 175° C. To replace the use of solder, studies are being made on sinter-type bonding materials employing metal particles. For example, Applicant has previously proposed a method for bonding two conductors with a joint portion constituted by a sintered product of a composition containing large-diameter copper particles having a relatively large particle size, small-diameter copper particles having a smaller particle size than the large-diameter copper particles, an amine compound, and a silane coupling agent having a reactive group reactive with the amine compound (see Patent Literature 1).

Bonding two conductors with a joint portion constituted by a sintered product of the aforementioned composition effectively relaxes stress caused by dimensional changes due to thermal expansion/contraction. In addition, the joint portion has high heat resistance and bonding strength and also has low resistance.

Other than the aforementioned technique, Patent Literature 2 discloses a technique for bonding two conductors by: producing a sheet by pressing a bonding material containing metal particles; interposing the sheet between the two conductors; and heating and firing the same in a compressed state. The bonding material contains a polyol that is solid at 25° C.

CITATION LIST

Patent Literature

Patent Literature 1: US 2017/0140847A1
Patent Literature 2: JP 2013-39580A

SUMMARY OF INVENTION

When bonding two conductors by using the composition disclosed in Patent Literature 1, sintering is typically performed by interposing the composition between the two conductors without pressurizing the same. However, depending on methods for using the composition or targets to which the composition is applied, it may be preferable to perform sintering in a pressurized state when interposing the composition between two conductors. This is because assisting sintering with pressure increases the driving force for sintering among the particles, which further promotes sintering and thereby further increases the bonding strength with a bonding-target substrate. Using the composition disclosed in Patent Literature 1 in such cases can achieve sufficient bonding strength. However, since the composition flows between the two conductors, the composition may flow out from between the two conductors depending on the application pattern. Outflow of the composition from between the two conductors may make it difficult to control the thickness of the composition between the two conductors, which may result in uneven thickness of the joint portion made by the sintered product of the composition. Moreover, the outflow itself may impair the reliability of the semiconductor package.

An objective of the present invention is to provide a bonding composition and a bonding structure capable of overcoming the various issues associated with the aforementioned conventional art.

The present invention achieves the aforementioned objective by providing a bonding composition containing copper powder, a liquid medium, and a reducing agent, wherein: the reducing agent contains at least one amino group and a plurality of hydroxyl groups; the reducing agent has a boiling point that is higher than the boiling point of the liquid medium; and the reducing agent has a melting point that is equal to or below the sintering temperature of the copper powder.

The present invention also provides a method for producing a conductor bonding structure, the method involving:

applying the aforementioned bonding composition onto a surface of a first conductor, to form a coating film;

drying the coating film, to remove at least a portion of the liquid medium and thereby obtain a dried coating film;

applying a second conductor onto the dried coating film, to interpose the dried coating film between the first conductor and the second conductor; and heating the dried coating film, to sinter the copper powder contained in the dried coating film and thereby bond the first conductor and the second conductor.

The present invention also provides a conductor bonding structure in which two conductors are electrically connected by a joint portion, wherein: the joint portion is made from a material constituted mainly by copper; and moiety (3) below is formed in the joint portion:

[Chem. 1]

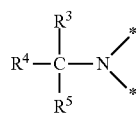

(3)

wherein:
$R^3$ to $R^5$ each independently represent a hydrogen atom, a hydroxyl group, a hydrocarbon group having 1 to 10 carbon atoms, or a hydrocarbon group having 1 to 10 carbon atoms and containing a hydroxyl group; and
\* represents a bonding hand with copper.

DESCRIPTION OF EMBODIMENTS

The present invention is described below according to preferred embodiments thereof. The present invention relates to a bonding composition containing copper powder, a liquid medium, and a reducing agent. The bonding composition of the present invention can suitably be used for bonding two conductors. By interposing the bonding composition between two conductors and firing the same in this state, the bonding composition is made into a conductive film, thereby bonding the two conductors and also providing electrical continuity therebetween.

The bonding composition contains the following constituent components, which are each described below:
(a) copper powder;
(b) a liquid medium; and
(c) a reducing agent.

The copper powder (a) contained in the bonding composition is constituted by an aggregate of copper particles. Hereinbelow, depending on the context, "copper powder" may refer to copper particles, or to an aggregate of copper particles. Copper particles are particles including copper as a main constituent component, and may, for example, substantially solely include copper with the balance being unavoidable impurities, or may include copper as a main ingredient (e.g., in a proportion exceeding 50 mass %) and other additional component(s). From the viewpoint of improving conductivity, the copper particles preferably include at least 80 mass % of copper.

The copper particles may, for example, be spherical, or may have shapes other than spherical, such as flaky, platy, dendritic, or rod-like. The shape of the copper particles depends on the process of preparation. For example, copper particles obtained by a wet reduction process or an atomization process tend to take on a spherical shape, and those obtained by an electroreduction process tend to assume a dendritic or rod-like shape. Flaky or platy particles may be obtained by, for example, plastically flattening spherical particles by applying a mechanical outer force. The copper particles may, for example, be constituted solely by spherical particles, or may be a mixture of spherical particles and flaky particles, etc.

In cases where the copper particles are spherical, the particle size in terms of volume cumulative particle diameter at a cumulative volume of 50 vol %, $D_{SEM50}$, as measured by image analysis under observation with a scanning electron microscope, is preferably 0.03 μm or greater, more preferably 0.05 μm or greater, and preferably 20 μm or less, more preferably 10 μm or less.

$D_{SEM50}$ is found as follows. From a scanning electron microscope image of the copper particles, at least 50 particles are selected randomly to measure the particle size (Heywood diameter) thereof. Then, the volume is calculated from the obtained particle size, assuming that each particle is a perfect sphere, and the volume cumulative particle diameter at a cumulative volume of 50 vol % is defined as $D_{SEM50}$.

More specifically, Mac-View from Mountech Co., Ltd. is used to read-in image data of the copper particles. Then, at least 50 particles are selected randomly from the copper particles on the data, to measure the particle size (Heywood diameter) of the respective particles, the area S of a two-dimensional projection of the respective particles, and the perimeter L of the two-dimensional projection of the respective particles. Then, the volume is calculated from the obtained Heywood diameter, assuming that each particle is a perfect sphere, and the volume cumulative particle diameter at a cumulative volume of 50 vol % is defined as $D_{SEM50}$.

Whether or not the copper particles are spherical is determined by the following method. From the area S and the perimeter L of each of the particles selected randomly according to the aforementioned method, the circularity coefficient $4\pi S/L^2$ is calculated, and the arithmetic mean thereof is calculated. The copper particles are determined as spherical in cases where the arithmetic mean of the circularity coefficients is preferably 0.85 or greater, more preferably 0.90 or greater.

In cases where the copper particles are flaky, the volume cumulative particle diameter at a cumulative volume of 50 vol %, $D_{50}$, found by laser diffraction/scattering particle size distribution measurement is preferably 0.3 μm or greater, more preferably 0.5 μm or greater, even more preferably 0.7 μm or greater. The particle size of flaky copper particles in terms of $D_{50}$ is preferably 100 μm or less, more preferably 70 μm or less, even more preferably 50 μm or less. Including particles with such particle sizes enables the formation of a densely-sintered coating film, thus achieving high bonding strength between conductors and improvement in conductive reliability. "Flaky" refers to a shape having a pair of plate surfaces forming the principal surfaces of each particle, and a side surface orthogonal to the plate surfaces; the plate surfaces and the side surface may each independently be flat, curved, or uneven.

$D_{50}$ can be measured by the following method, for example. A sample to be measured weighing 0.1 g is mixed with an aqueous liquid of a dispersant, and dispersed for 1 minute using an ultrasonic homogenizer (US-300T from Nihonseiki Kaisha Ltd.); and the resulting dispersion is then analyzed for particle size distribution using a laser diffraction/scattering particle size distribution measurement device, e.g., MT3300 EXII from MicrotracBEL Corp. This measurement method is also applicable to copper particles having shapes other than spherical.

In cases where the copper particles contain flaky particles, it is preferable that, in each flaky copper particle, the ratio of the length of the long axis a to the length of the short axis b (hereinbelow also called "aspect ratio (a/b)") is preferably 2 or greater, more preferably 5 or greater. The aspect ratio is also preferably 80 or less, more preferably 40 or less. Including particles with such shapes enables the formation of a densely-sintered coating film, thus achieving high bonding strength between conductors and improvement in conductive reliability.

The lengths of the long axis a and short axis b of a flaky copper particle can be found as follows. For each particle to be measured, the longest line segment of the particle's transverse length is determined, and the particle image is rotated by 360 degrees about the line segment as the rotation axis, to assume a three-dimensional shape. The obtained three-dimensional shape is projected in a direction orthogonal to the rotation axis to obtain a two-dimensional projection, and a rectangle circumscribed by the two-dimensional projection is determined. The length of the long side of the rectangle is defined as the long axis a. As for the short axis b, the aforementioned three-dimensional shape is projected in the direction along the rotation axis to obtain a two-dimensional projection, and a rectangle circumscribed by the two-dimensional projection is determined. The length of the long side of this rectangle is defined as the short axis b. At least 50 particles are selected randomly, and for each particle, the long axis a and the short axis b are determined according to the aforementioned method. The arithmetic mean is calculated respectively for the long axis and the short axis.

The liquid medium (b) contained in the bonding composition is used for dispersing the copper powder and the reducing agent to provide the bonding composition with a paste- or ink-like property. Preferably, the liquid medium is liquid at room temperature (25° C.). Further, from the viewpoint of improving printability of the bonding composition and allowing the reducing agent to exist uniformly in the bonding composition, it is preferable that the liquid medium is capable of dissolving the reducing agent (c). Furthermore, from the viewpoint of suppressing oxidation of the copper powder, it is preferable that the liquid medium is a nonaqueous medium, and preferably, for example, a monovalent or polyvalent alcohol. Particularly, from the viewpoint of printability of the bonding composition, solubility of the reducing agent into the liquid medium, and volatility of the liquid medium, it is preferable that the alcohol is a polyol having a boiling point below 300° C. Examples of polyols include propylene glycol (boiling point: 188° C.), ethylene glycol (boiling point: 197° C.), hexylene glycol (boiling point: 197° C.), diethylene glycol (boiling point: 245° C.), 1,3-butanediol (boiling point: 207° C.), 1,4-butanediol (boiling point: 228° C.), dipropylene glycol (boiling point: 231° C.), tripropylene glycol (boiling point: 273° C.), glycerin (boiling point: 290° C.), polyethylene glycol 200 (boiling point: 250° C.), and polyethylene glycol 300 (boiling point: 250° C.). One type of liquid medium may be used singly, or two or more types may be used in combination.

The reducing agent (c) contained in the bonding composition is used for promoting sintering among the copper particles by firing of the bonding composition. For this purpose, it is advantageous for the reducing agent to have a moiety containing at least one amino group and a plurality of hydroxyl groups. Using a reducing agent having such a moiety can promote sintering among the copper particles and thereby obtain a dense sintered structure, compared to reducing agents that include a plurality of hydroxyl groups but do not contain any amino groups. Thus, even with a small amount of reducing agent, it is possible to obtain a bonding structure having a joint portion with high bonding strength.

Further, from the viewpoint of increasing reducing power, the reducing agent preferably contains three or more hydroxyl groups, more preferably four or more hydroxyl groups, even more preferably five or more hydroxyl groups.

Preferably, the reducing agent has a boiling point that is higher than the boiling point of the liquid medium, and the reducing agent has a melting point that is equal to or below the sintering temperature of the copper powder. Thus, the reducing agent can remain in the bonding composition during drying of the bonding composition (i.e., when removing the liquid medium by drying the coating film of the bonding composition, and thereby obtaining a dried coating film), and can melt during firing of the dried bonding composition (i.e., when firing the dried coating film of the bonding composition, to sinter the copper powder). Using such a reducing agent allows the liquid medium to be removed from the coating film of the bonding composition, thereby achieving excellent shape retainability of the dried coating film of the bonding composition. As a result, even when the dried coating film of the bonding composition is pressurized during firing, the bonding composition is less prone to flow out from between the two conductors, thereby facilitating the control of thickness. Moreover, the reducing agent melts during firing of the dried coating film of the bonding composition and spreads uniformly within the dried coating film, which can thereby promote uniform sintering of the copper powder and achieve a denser sintered structure.

From the viewpoint of improving shape retainability of the dried coating film, it is preferable that the reducing agent is solid at room temperature (25° C.). From the aforementioned viewpoint, the melting point of the reducing agent is preferably from 30° C. to 200° C., more preferably from 50° C. to 200° C., even more preferably from 70° C. to 200° C.

From the aforementioned viewpoint, the boiling point of the reducing agent is preferably 300° C. or higher, more preferably 330° C. or higher, even more preferably 350° C. or higher.

From the viewpoint of improving printability of the bonding composition and allowing the reducing agent to exist uniformly in the bonding composition, it is preferable that the reducing agent is dissolvable in the liquid medium at room temperature (25° C.), or stays dissolved without precipitating out after heating the liquid medium and dissolving the reducing agent and then cooling the solution back to room temperature (25° C.). Whether or not the reducing agent has dissolved in the liquid medium is determined by adding 6 g of the reducing agent to 4 g of the liquid medium and dissolving the reducing agent according to the aforementioned condition, and observing whether the entirety of the reducing agent dissolved or not.

From the aforementioned viewpoint, it is preferable to use, as the reducing agent, an amino alcohol compound represented by formula (1) or (2) below.

[Chem. 2]

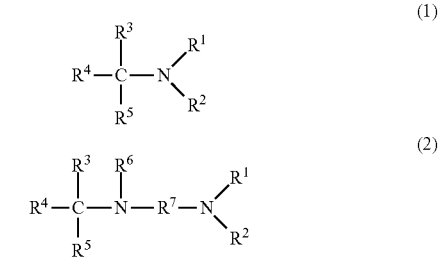

In formula (1) or (2), $R^1$ to $R^6$ each independently represent a hydrogen atom, a hydroxyl group, a hydrocarbon group having 1 to 10 carbon atoms, or a hydrocarbon group having 1 to 10 carbon atoms, preferably 1 to 4 carbon atoms, and containing a hydroxyl group. Examples of hydrocarbon groups include saturated or unsaturated aliphatic groups.

The aliphatic group may be a straight chain or a branched chain. Examples of the hydrocarbon group may include methyl, ethyl, and propyl.

In formula (2), $R^7$ represents a divalent hydrocarbon group having 1 to 10 carbon atoms, preferably 1 to 4 carbon atoms, or a divalent hydrocarbon group having 1 to 10 carbon atoms, preferably 1 to 4 carbon atoms, and containing a hydroxyl group. Examples of hydrocarbon groups include saturated or unsaturated aliphatic groups. The aliphatic group may be a straight chain or a branched chain. Examples of the hydrocarbon group may include methylene, ethylene, propylene, and butylene.

In formula (1), at least two of $R^1$ to $R^5$ contain a hydroxyl group. Stated differently, at least two of $R^1$ to $R^5$ are each a hydroxyl group or a hydrocarbon group having 1 to 10 carbon atoms and containing a hydroxyl group. In formula (2), at least two of $R^1$ to $R^6$ contain a hydroxyl group. Stated differently, at least two of $R^1$ to $R^6$ are each a hydroxyl group or a hydrocarbon group having 1 to 10 carbon atoms and containing a hydroxyl group. Particularly, in formula (1), it is preferable that at least two of $R^1$ to $R^5$ are each a lower hydroxyalkyl group having 1 to 4 carbon atoms. Further, in formula (2), it is preferable that at least two of $R^1$ to $R^6$ are each a lower hydroxyalkyl group having 1 to 4 carbon atoms. In this case, the hydroxyl group in the hydroxyalkyl group is preferably bonded to a terminal of the alkyl group.

From the viewpoint of improving reducing power, it is preferable that, in the reducing agent represented by formula (1), at least three of $R^1$ to $R^5$ contain a hydroxyl group, and more preferably at least four contain a hydroxyl group; and it is even more preferable that five hydroxyl groups are included. For the same reason, it is preferable that, in the reducing agent represented by formula (2), at least three of $R^1$ to $R^6$ contain a hydroxyl group, and more preferably at least four contain a hydroxyl group; and it is even more preferable that five hydroxyl groups are included.

Concrete examples of amino alcohol compounds represented by formula (1) or (2) include bis(2-hydroxyethyl)iminotris(hydroxymethyl)methane (BIS-TRIS; melting point: 104° C.; boiling point: above 300° C.; falls under formula (1)), 2-amino-2-(hydroxymethyl)-1,3-propanediol (TRIS; melting point: 169-173° C.; boiling point: above 300° C.; falls under formula (1)), and 1,3-bis(tris(hydroxymethyl)methylamino)propane (BIS-TRIS propane; melting point: 164-165° C.; boiling point: above 300° C.; falls under formula (2)). These compounds all have high melting points and can stay in liquid form during the drying step, and are thus preferable from the viewpoint of providing the coating film with excellent smoothness.

One type of the aforementioned reducing agent may be used singly, or two or more types may be used in combination. In either case, from the viewpoint of improving sinterability of the copper particles, the proportion of the reducing agent in the bonding composition is preferably 0.1 parts by mass or greater, more preferably 1 part by mass or greater, with respect to 100 parts by mass of the copper powder. From the viewpoint of densifying the sintered structure of copper, the proportion of the reducing agent is preferably 10 parts by mass or less, more preferably 8 parts by mass or less, with respect to 100 parts by mass of the copper powder.

On the other hand, from the viewpoint of providing the bonding composition with moderate viscosity and also improving the shape retainability of the coating film when the bonding composition is applied onto the conductor, the proportion of the liquid medium in the bonding composition is preferably from 10 parts to 40 parts by mass, more preferably from 10 parts to 35 parts by mass, with respect to 100 parts by mass of the copper powder.

From the viewpoint of improving applicability or printability, the bonding composition has a viscosity (at 25° C.), in a state before being fired, of preferably from 10 Pa·s to 200 Pa·s, more preferably from 15 Pa·s to 200 Pa·s, further preferably from 20 Pa·s to 180 Pa·s, even more preferably from 20 Pa·s to 100 Pa·s, further more preferably from 20 Pa·s to 60 Pa·s. The viscosity of the bonding composition is measured with a rheometer (viscoelasticity measurement device). The measurement value is a value at a shear rate of 10 s$^{-1}$ when using a parallel-type sensor.

In addition to the aforementioned components (a) to (c), the bonding composition may include other components. Examples of such components include binder components, surface tension adjusters, antifoaming agents, and viscosity adjusters. The total amount of these components in the bonding composition is preferably from 0.1 parts to 10 parts by mass with respect to 100 parts by mass of the copper powder.

Next, a method for producing a conductor bonding structure using the aforementioned bonding composition is described below. The bonding structure includes two conductors electrically connected by a copper joint portion. To produce this bonding structure, first, a first conductor is subjected to an application step. In the application step, the bonding composition is applied onto a surface of the first conductor, to form a coating film. Means for applying the bonding composition is not particularly limited, and known application means can be used. For example, screen printing, dispense printing, gravure printing, or offset printing can be used.

From the viewpoint of forming a sufficiently-thick bonding structure, the thickness of the coating film is preferably set within a range from 1 μm to 200 μm, more preferably from 5 μm to 150 μm.

When the coating film of the bonding composition has been formed, the coating film is subjected to a drying step. In the drying step, at least a portion of the liquid medium is removed from the coating film by drying, to thereby obtain a dried coating film with a reduced amount of the liquid medium. By removing the liquid medium from the coating film, the shape retainability of the dried coating film can be further improved, which results in that, when pressure is applied to the dried coating film in the later-described firing step, the dried coating film can be suppressed from getting deformed, thereby effectively preventing the dried coating film from overflowing from between the two conductors. Herein, "dried coating film" refers to a coating film that has been dried such that the content of the liquid medium has been reduced to 9 mass % or less with respect to the total mass of the coating film.

To remove the liquid medium, various means employing the volatility of the liquid medium can be used, such as natural drying, hot-air drying, IR irradiation, or hot-plate drying. As described above, the proportion of the liquid medium in the dried coating film, after removal of the liquid medium, is preferably 9 parts by mass or less, more preferably 7 parts by mass or less, even more preferably 5 parts by mass or less, with respect to 100 parts by mass of the total mass of the coating film.

When the dried coating film has been obtained, a second conductor is then applied onto the dried coating film. The first conductor and the second conductor may be made from the same material, or may be made from different materials. Considering bondability with the copper powder contained in the coating film, the conductors are preferably made from metal, such as copper, silver, or gold.

The dried coating film sandwiched between the two conductors is then subjected to a firing step. In the firing step, the coating film is heated, and thereby the copper particles contained in the coating film are sintered. The atmosphere for firing is preferably an inert gas atmosphere. Examples of inert gases that may suitably be used include nitrogen and argon. The firing temperature is preferably from 150° C. to 350° C., more preferably from 200° C. to 350° C., even more preferably from 230° C. to 300° C. The firing time is preferably from 0.5 minutes to 60 minutes, particularly preferably from 1 minute to 30 minutes, on condition that the firing temperature is within the aforementioned range.

Firing can be performed either under pressure or in a pressureless state. Herein, "pressureless" means that no pressure is applied to the dried coating film other than force (gravity) from the two conductors' own weight. Pressureless firing has advantages such as that semiconductor chips with different heights can be bonded simultaneously and that there is no need for a pressurizing device. On the other hand, in cases of performing firing under pressure, it is preferable to apply a pressure of from 0.001 MPa to 20 MPa, more preferably from 0.01 MPa to 15 MPa, with the aim of assisting sintering among the copper particles.

When a conventionally-known bonding composition, such as the bonding composition disclosed in Patent Literature 1, is fired under pressure, since the coating film is not dry, the coating film will deform due to its high flowability and overflow from between the two conductors. If, on the other hand, the coating film formed by the bonding composition of Patent Literature 1 is dried to prevent overflowing of the coating film, sintering adjuvants will also volatilize along with the liquid medium. Thus, pressurized firing by using such a coating film results in poor sinterability of copper, leading to insufficient bonding strength.

In contrast, because the present invention employs a specific type of reducing agent to be contained in the bonding composition, it is possible to effectively prevent overflowing of the coating film while achieving sufficiently high bonding strength, even when the coating film is dried and then subjected to firing under pressure. Firing also causes the copper particles in the dried coating film to be sintered sufficiently, thereby forming a dense sintered structure. As a result, the first and second conductors are electrically connected by a joint portion constituted by the sintered product of the bonding composition. Furthermore, the formation of a dense sintered structure significantly improves the bonding strength between the two conductors. In addition, because of the high progression of sintering among the copper particles, the joint portion is provided with a structure close to bulk copper. This results in high thermal conductivity at the joint portion.

The joint portion formed as above is made from a material constituted mainly by copper. In cases where the bonding composition used for forming the joint portion contains a reducing agent represented by the aforementioned formula (1), the joint portion will include the following moiety (3).

[Chem. 3]

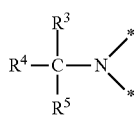

(3)

In the formula, $R^3$ to $R^5$ each independently represent a hydrogen atom, a hydroxyl group, a hydrocarbon group having 1 to 10 carbon atoms, or a hydrocarbon group having 1 to 10 carbon atoms and containing a hydroxyl group. Details of $R^3$ to $R^5$ are as described above. Further, "*" represents a bonding hand with copper.

Whether or not the aforementioned moiety (3) is formed in the joint portion can be verified by, for example, subjecting a cross-sectional surface of the joint portion to mass spectrometry by TOF-SIMS. For example, in cases of using BIS-TRIS as the reducing agent, fragments with a molecular weight of 152 ascribable to C—N(Cu)$_2$ can be observed in a positive TOF-SIMS mass spectrum.

It is preferable to adjust the thickness of the joint portion such that the two conductors are bonded reliably and such that sufficiently high electroconductivity and thermal conductivity can be obtained. For example, the thickness of the joint portion is preferably from 1 μm to 200 μm, more preferably from 3 μm to 150 μm. The thickness of the joint portion can be controlled by, for example, adjusting the thickness of the coating film of the aforementioned bonding composition. The thickness of the joint portion is measured by polishing the joint portion after embedding it in resin, and observing the polished surface with an electron microscope.

A conductor bonding structure including the aforementioned joint portion can suitably be used in high-temperature environments, such as for on-vehicle electronic circuits or power device-equipped electronic circuits, by making use of its high bonding strength and thermal conductivity.

EXAMPLES

The present invention is described in further detail below according to examples. The scope of the present invention, however, is not limited to the following examples. Unless specifically stated otherwise, "%" and "parts" respectively refer to "mass %" and "parts by mass".

Example 1

(1) Preparing Bonding Composition

For the copper powder, spherical copper particles having a $D_{SEM50}$ of 0.16 μm were used. For the reducing agent, bis(2-hydroxyethyl)iminotris(hydroxymethyl)methane was used. The reducing agent was solid at 25° C., and had a melting point of 104° C. and boiling point above 300° C. For the liquid medium, ethylene glycol was used. The liquid medium had a boiling point of 197° C. These components were mixed, to obtain a bonding composition in paste-form. The proportion of the reducing agent in the bonding composition was 2.5 parts with respect to 100 parts of the copper powder. The proportion of the liquid medium was 22.5 parts with respect to 100 parts of the copper powder. The viscosity of the bonding composition at a shear rate of 10 s$^{-1}$ was 25 Pa·s at 25° C.

(2) Producing Bonding Structure

In the center of a 10-mm square copper plate (thickness: 0.5 mm), the bonding composition was applied by screen printing, to form a coating film. The coating film was formed in a 5-mm square. The thickness of the coating film was 35 μm. The coating film was dried in a hot-air dryer at 110° C. for 10 minutes to remove the liquid medium, and was then left at room temperature, to obtain a dried coating film. The content of the liquid medium in the dried coating film was verified to be 4 mass % or less.

Then, a 5-mm square copper plate (thickness: 0.5 mm) was placed on the dried coating film. In this state, a pressure of 6 MPa was applied, and firing was performed in a nitrogen atmosphere at 280° C. for 10 minutes, to thereby prepare two bonding structures. The formation of a moiety represented by the aforementioned moiety (3) in the copper joint portion was verified by mass spectrometry by TOF-SIMS.

Example 2

A paste-form bonding composition was obtained as in Example 1, except that the proportion of the reducing agent in the bonding composition was changed to 5.0 parts with respect to 100 parts of the copper powder, and the proportion of the liquid medium was changed to 20.0 parts with respect to 100 parts of the copper powder. The viscosity of the bonding composition at a shear rate of 10 s$^{-1}$ was 42 Pa·s at 25° C. A dried coating film was obtained according to the same conditions as in Example 1. The content of the liquid medium in the dried coating film was verified to be 4 mass % or less. A bonding structure was produced according to the same conditions as in Example 1. The formation of a moiety represented by the aforementioned moiety (3) in the copper joint portion was verified by mass spectrometry by TOF-SIMS.

Comparative Example 1

A paste-form bonding composition was obtained as in Example 1, except that meso-erythritol (melting point: 121° C.; boiling point: 330° C.) was used for the reducing agent, with the proportion of the reducing agent in the bonding composition being 2.5 parts with respect to 100 parts of the copper powder and the proportion of the liquid medium being 22.5 parts with respect to 100 parts of the copper powder. The viscosity of the bonding composition at a shear rate of 10 s$^{-1}$ was 59 Pa·s at 25° C. A dried coating film was obtained according to the same conditions as in Example 1. The content of the liquid medium in the dried coating film was verified to be 4 mass % or less. A bonding structure was produced according to the same conditions as in Example 1. Non-formation of a moiety represented by the aforementioned moiety (3) in the copper joint portion was verified by mass spectrometry by TOF-SIMS. Note that meso-erythritol is a reducing agent that contains four hydroxyl groups but no amino group.

Comparative Example 2

A paste-form bonding composition was obtained as in Example 1, except that meso-erythritol (melting point: 121° C.; boiling point: 330° C.) was used for the reducing agent, the proportion of the reducing agent in the bonding composition was changed to 5.0 parts with respect to 100 parts of the copper powder, and the proportion of the liquid medium was changed to 20.0 parts with respect to 100 parts of the copper powder. The viscosity of the bonding composition at a shear rate of 10 s$^{-1}$ was 70 Pa·s at 25° C. A dried coating film was obtained according to the same conditions as in Example 1. The content of the liquid medium in the dried coating film was verified to be 4 mass % or less. A bonding structure was produced according to the same conditions as in Example 1. Non-formation of a moiety represented by the aforementioned moiety (3) in the copper joint portion was verified by mass spectrometry by TOF-SIMS.

Comparative Example 3

A paste-form bonding composition was obtained as in Example 1, except that trimethylolpropane (melting point: 58° C.; boiling point: 296° C.) was used for the reducing agent, with the proportion of the reducing agent in the bonding composition being 2.5 parts with respect to 100 parts of the copper powder and the proportion of the liquid medium being 22.5 parts with respect to 100 parts of the copper powder. The viscosity of the bonding composition at a shear rate of 10 s$^{-1}$ was 51 Pa·s at 25° C. A dried coating film was obtained according to the same conditions as in Example 1. The content of the liquid medium in the dried coating film was verified to be 4 mass % or less. A bonding structure was produced according to the same conditions as in Example 1. Non-formation of a moiety represented by the aforementioned moiety (3) in the copper joint portion was verified by mass spectrometry by TOF-SIMS. Note that trimethylolpropane is a reducing agent that contains hydroxyl groups but no amino group.

Comparative Example 4

A paste-form bonding composition was obtained as in Example 1, except that trimethylolpropane (melting point: 58° C.; boiling point: 296° C.) was used for the reducing agent, the proportion of the reducing agent in the bonding composition was changed to 5.0 parts with respect to 100 parts of the copper powder, and the proportion of the liquid medium was changed to 20.0 parts with respect to 100 parts of the copper powder. The viscosity of the bonding composition at a shear rate of 10 s$^{-1}$ was 66 Pa·s at 25° C. A dried coating film was obtained according to the same conditions as in Example 1. The content of the liquid medium in the dried coating film was verified to be 4 mass % or less. A bonding structure was produced according to the same conditions as in Example 1. Non-formation of a moiety represented by the aforementioned moiety (3) in the copper joint portion was verified by mass spectrometry by TOF-SIMS.

Example 3

The copper powder in the bonding composition was changed to a mixture of spherical copper powder having a $D_{SEM50}$ of 0.14 μm and flaky copper powder having a $D_{50}$ of 4.9 μm and an aspect ratio of 13. The content by percentage of each of the spherical copper powder and the flaky copper powder in the copper powder mixture was 70 mass % spherical copper powder to 30 mass % flaky copper powder. The proportion of the reducing agent was 2.5 parts with respect to 100 parts of the copper powder. Also, the liquid medium was changed to a mixture of polyethylene glycol 300 and hexylene glycol. The content of each liquid medium with respect to 100 parts of the copper powder was as shown in Table 2. Other than the above, a paste-form bonding composition was obtained as in Example 1. The viscosity of the bonding composition at a shear rate of 10 s$^{-1}$ was 34 Pa·s at 25° C. A dried coating film was obtained according to the same conditions as in Example 1. The content of the liquid medium in the dried coating film was verified to be 5 mass % or less. A bonding structure was produced according to the same conditions as in Example 1. The formation of a moiety represented by the aforementioned moiety (3) in the copper joint portion was verified by mass spectrometry by TOF-SIMS.

Example 4

The copper powder in the bonding composition was changed to the mixture of the spherical copper powder and the flaky copper powder as in Example 3. The proportion of the reducing agent was changed to 0.1 parts with respect to 100 parts of the copper powder. Also, the liquid medium was changed to a mixture of polyethylene glycol and hexylene glycol. The content of each liquid medium with respect to 100 parts of the copper powder was as shown in Table 2. Other than the above, a paste-form bonding composition was obtained as in Example 1. The viscosity of the bonding composition at a shear rate of 10 s$^{-1}$ was 14 Pa·s at 25° C. A dried coating film was obtained according to the same conditions as in Example 1. The content of the liquid medium in the dried coating film was verified to be 5 mass % or less. A bonding structure was produced according to the same conditions as in Example 1. The formation of a moiety represented by the aforementioned moiety (3) in the copper joint portion was verified by mass spectrometry by TOF-SIMS.

Evaluation

The bonding structures obtained in the Examples and Comparative Examples were evaluated and measured for appearance and shear strength according to the following methods. The respective dried coating films were evaluated for appearance according to the following method. The results are shown in Tables 1 and 2 below.

Appearance of Dried Coating Film

Each dried coating film was visually observed to check for cracks, foreign substances on the surface, and presence of holes, and was rated according to the following criteria.

A: No cracks, foreign substances on surface, or holes were observed.

B: Either cracks, foreign substances on surface, or holes were observed.

Appearance of Joint Portion

Each joint portion was visually observed, to rate the degree of overflowing from the periphery of the copper plates according to the following criteria.

A: No overflowing of the joint portion from the periphery of the copper plates was observed.

B: Overflowing of the joint portion from the periphery of the copper plates was observed.

Shear Strength

Shear strength of each bonding structure was measured using a Condor Sigma bond tester from XYZTEC. Shear strength was rated according to the following criteria. Shear strength (MPa) is a value defined as follows: breaking load (N)/joint area (mm$^2$).

A: 30 MPa or greater.

B: Less than 30 MPa.

TABLE 1

| | Bonding composition | | | | | | Evaluation | | | |
| | Copper powder | Reducing agent | | Liquid medium | | | Appearance | | Bonding strength | |
| | Content (parts by mass) | Type | Content (parts by mass) | Type | Content (parts by mass) | Viscosity (@ 10 s$^{-1}$) Pa·s | Dried coating film | Joint portion | Shear strength (MPa) | Evaluation |
|---|---|---|---|---|---|---|---|---|---|---|
| Example 1 | 100 | Bis(2-hydroxyethyl)iminotris(hydroxymethyl)methane | 2.5 | Ethylene glycol | 22.5 | 25 | A | A | Over 40 | A |
| Example 2 | 100 | | 5.0 | | 20.0 | 42 | A | A | Over 40 | A |
| Comparative Example 1 | 100 | Meso-erythritol | 2.5 | | 22.5 | 59 | A | A | 9 | B |
| Comparative Example 2 | 100 | | 5.0 | | 20.0 | 70 | B | A | Over 40 | A |
| Comparative Example 3 | 100 | Trimethylolpropane | 2.5 | | 22.5 | 51 | B | A | 3 | B |
| Comparative Example 4 | 100 | | 5.0 | | 20.0 | 66 | B | A | 5 | B |

TABLE 2

| | Bonding composition | | | | | | | | Evaluation | | | |
| | Copper powder mixture | | | Reducing agent | | Liquid medium | | | Appearance | | Bonding strength | |
| | Copper powder 1 | Copper powder 2 | Content (parts by mass) | Type | Content (parts by mass) | Type | Content (parts by mass) | Viscosity (@ 10 s$^{-1}$) Pa·s | Dried coating film | Joint portion | Shear strength (MPa) | Evaluation |
|---|---|---|---|---|---|---|---|---|---|---|---|---|
| Example 3 | Spherical (70 mass % in mixture) | Flaky (30 mass % in mixture) | 100 | Bis(2-hydroxyethyl)iminotris(hydroxymethyl)methane | 2.5 | Polyethylene glycol 300 | 1.0 | 34 | A | A | Over 30 | A |
| | | | | | | Hexylene glycol | 31.6 | | | | | |

TABLE 2-continued

| | Bonding composition | | | | | | | | Evaluation | | | |
|---|---|---|---|---|---|---|---|---|---|---|---|---|
| | Copper powder mixture | | Content | Reducing agent | Content | Liquid medium | Content | | Appearance | | Bonding strength | |
| | Copper powder 1 | Copper powder 2 | (parts by mass) | Type | (parts by mass) | Type | (parts by mass) | Viscosity (@ 10 s$^{-1}$) Pa·s | Dried coating film | Joint portion | Shear strength (MPa) | Evaluation |
| Example 4 | Spherical (70 mass % in mixture) | Flaky (30 mass % in mixture) | 100 | | 0.1 | Polyethylene glycol 300 Hexylene glycol | 3.4 31.6 | 14 | A | A | Over 30 | A |

The results shown in Tables 1 and 2 clearly show that, as for the bonding structures obtained according to the Examples, no overflowing of the bonding composition from the copper plates was observed and a joint portion with a uniform thickness was obtained, even though each bonding structure was produced by firing the bonding composition under pressure. The results also show that the bonding structures obtained according to the Examples have high bonding strength with the copper plates.

INDUSTRIAL APPLICABILITY

The present invention facilitates the formation of a bonding structure that includes a joint portion having high bonding strength, and that causes minimal overflowing of the bonding composition.

The invention claimed is:

1. A bonding composition comprising copper powder, a liquid medium, and a reducing agent, wherein:
   the reducing agent contains at least one amino group and a plurality of hydroxyl groups;
   the reducing agent has a boiling point that is higher than a boiling point of the liquid medium;
   the reducing agent has a melting point that is equal to or below the sintering temperature of the copper powder; and
   the reducing agent is represented by formula (1) or (2) below:

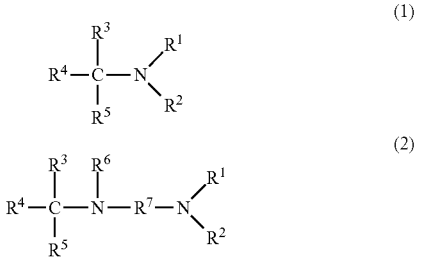

wherein:
   $R^1$ to $R^5$ each independently represent a hydrogen atom, a hydroxyl group, a saturated or unsaturated aliphatic group having 1 to 10 carbon atoms, or a saturated or unsaturated aliphatic group having 1 to 10 carbon atoms and containing a hydroxyl group; and at least two of $R^1$ to $R^5$ contain a hydroxyl group; and
   $R^6$ to $R^{11}$ each independently represent a hydrogen atom, a hydroxyl group, a hydrocarbon group having 1 to 10 carbon atoms, or a hydrocarbon group having 1 to 10 carbon atoms and containing a hydroxyl group; $R^{12}$ represents a hydrocarbon group having 1 to 10 carbon atoms or a hydrocarbon group having 1 to 10 carbon atoms and containing a hydroxyl group; and at least two of $R^6$ to $R^{11}$ contain a hydroxyl group.

2. The bonding composition according to claim 1, wherein the reducing agent is bis(2-hydroxyethyl)iminotris(hydroxymethyl)methane.

3. The bonding composition according to claim 1, wherein the bonding composition has a viscosity of from 10 Pa·s to 200 Pa·s at a shear rate of 10 s$^{-1}$ at 25° C.

4. The bonding composition according to claim 1, comprising the copper powder, from 0.1 parts to 10 parts by mass of reducing agent with respect to 100 parts by mass of the copper powder, and from 10 parts to 40 parts by mass of the liquid medium with respect to 100 parts by mass of the copper powder.

5. A method for producing a conductor bonding structure, the method comprising:
   applying the bonding composition according to claim 1 onto a surface of a first conductor to form a coating film;
   drying the coating film to remove at least a portion of the liquid medium and thereby obtain a dried coating film;
   applying a second conductor onto the dried coating film to interpose the dried coating film between the first conductor and the second conductor; and
   heating the dried coating film, to sinter the copper powder contained in the dried coating film and thereby bond the first conductor and the second conductor.

6. The bonding composition according to claim 2, wherein the bonding composition has a viscosity of from 10 Pas to 200 Pas at a shear rate of 10 s$^{-1}$ at 25° C.

7. The bonding composition according to claim 2, comprising the copper powder, from 0.1 parts to 10 parts by mass of reducing agent with respect to 100 parts by mass of the copper powder, and from 10 parts to 40 parts by mass of the liquid medium with respect to 100 parts by mass of the copper powder.

8. The bonding composition according to claim 3, comprising the copper powder, from 0.1 parts to 10 parts by mass of reducing agent with respect to 100 parts by mass of the copper powder, and from 10 parts to 40 parts by mass of the liquid medium with respect to 100 parts by mass of the copper powder.

9. The bonding composition according to claim 6, comprising the copper powder, from 0.1 parts to 10 parts by mass of reducing agent with respect to 100 parts by mass of the copper powder, and from 10 parts to 40 parts by mass of the liquid medium with respect to 100 parts by mass of the copper powder.

10. A method for producing a conductor bonding structure, the method comprising:
- applying the bonding composition according to claim 1 onto a surface of a first conductor to form a coating film;
- drying the coating film to remove at least a portion of the liquid medium and thereby obtain a dried coating film;
- applying a second conductor onto the dried coating film to interpose the dried coating film between the first conductor and the second conductor; and
- heating the dried coating film, to sinter the copper powder contained in the dried coating film and thereby bond the first conductor and the second conductor.

11. A method for producing a conductor bonding structure, the method comprising:
- applying the bonding composition according to claim 2 onto a surface of a first conductor to form a coating film;
- drying the coating film to remove at least a portion of the liquid medium and thereby obtain a dried coating film;
- applying a second conductor onto the dried coating film to interpose the dried coating film between the first conductor and the second conductor; and
- heating the dried coating film, to sinter the copper powder contained in the dried coating film and thereby bond the first conductor and the second conductor.

12. A method for producing a conductor bonding structure, the method comprising:
- applying the bonding composition according to claim 3 onto a surface of a first conductor to form a coating film;
- drying the coating film to remove at least a portion of the liquid medium and thereby obtain a dried coating film;
- applying a second conductor onto the dried coating film to interpose the dried coating film between the first conductor and the second conductor; and
- heating the dried coating film, to sinter the copper powder contained in the dried coating film and thereby bond the first conductor and the second conductor.

13. A method for producing a conductor bonding structure, the method comprising:
- applying the bonding composition according to claim 4 onto a surface of a first conductor to form a coating film;
- drying the coating film to remove at least a portion of the liquid medium and thereby obtain a dried coating film;
- applying a second conductor onto the dried coating film to interpose the dried coating film between the first conductor and the second conductor; and
- heating the dried coating film, to sinter the copper powder contained in the dried coating film and thereby bond the first conductor and the second conductor.

14. A method for producing a conductor bonding structure, the method comprising:
- applying the bonding composition according to claim 6 onto a surface of a first conductor to form a coating film;
- drying the coating film to remove at least a portion of the liquid medium and thereby obtain a dried coating film;
- applying a second conductor onto the dried coating film to interpose the dried coating film between the first conductor and the second conductor; and
- heating the dried coating film, to sinter the copper powder contained in the dried coating film and thereby bond the first conductor and the second conductor.

* * * * *